United States Patent [19]
Mukai

[11] Patent Number: 4,747,076
[45] Date of Patent: May 24, 1988

[54] METHOD OF WRITING INFORMATION INTO A FUSE-TYPE ROM

[75] Inventor: Ryoichi Mukai, Kanagawa, Japan

[73] Assignee: Fujitsu Limited, Kawasaki, Japan

[21] Appl. No.: 59,140

[22] Filed: Jun. 10, 1987

Related U.S. Application Data

[63] Continuation of Ser. No. 563,656, Dec. 20, 1983, abandoned.

[30] Foreign Application Priority Data

Dec. 25, 1982 [JP] Japan ................... 57-226520

[51] Int. Cl.⁴ .................................. G11C 17/00
[52] U.S. Cl. ........................................ 365/96; 357/65
[58] Field of Search ............. 365/94, 96, 103, 104, 365/105, 200; 357/65; 307/202.1

[56] References Cited

U.S. PATENT DOCUMENTS

| | | | |
|---|---|---|---|
| 4,402,067 | 8/1983 | Moss et al. | 365/189 X |
| 4,413,272 | 11/1983 | Mochizuki et al. | 357/65 |
| 4,480,318 | 10/1984 | Chong | 365/104 |

FOREIGN PATENT DOCUMENTS

| | | | |
|---|---|---|---|
| 56-156989 | 12/1981 | Japan | 365/96 |
| 1453858 | 10/1976 | United Kingdom . | |

OTHER PUBLICATIONS

"Programming Mechanism of Polysilicon Resistor Fuses," D. W. Greve, IEEE Transactions on Electron Devices, vol. Ed-29, No. 4, Apr. 1982, pp. 719-724.

Primary Examiner—Joseph A. Popek
Attorney, Agent, or Firm—Staas & Halsey

[57] ABSTRACT

Fuse-type ROM are provided with fuses which are formed on an insulating film, connected to conductor lines, and covered by a protective film. In order to write information into the fuse-type ROMs a ramp voltage is applied to the fuses so as to selectively and electrically blow the fuses without breaking the protective film. The ramp voltage increases substantially linearly, to a peak value, at a rate of from $10^3$ to $10^5$ volts/sec.

9 Claims, 4 Drawing Sheets ial. No. 563,656 filed on Dec. 20, 1983, now abandoned.

METHOD OF WRITING INFORMATION INTO A FUSE-TYPE ROM

This is a continuation of co-pending application Ser. No. 563,656 filed on Dec. 20, 1983, now abandoned.

BACKGROUND OF THE INVENTION

1. Field of the Invention

The present invention relates to a method of writing information into a fuse-type read only memory (ROM), and more particularly to a method of electrically blowing (i.e., opening) a fuse formed in a memory device for programming.

2. Description of the Prior Art

Semiconductor memory devices provided with fuses include a fuse-type ROM and a random access memory (RAM) with redundant circuits. In a fuse-type ROM (i.e., a fuse-link-programmable ROM), the fuses are selectively blown in order to write information, and in a RAM with redundant circuits, the fuses are selectively blown in order to replace a row or column containing a bad bit (i.e., defective memory cell) with a spare row or column: the replaced portion of the RAM can be regarded as a ROM portion. The fuse blowout is achieved by feeding an excess current and voltage to the fuse.

In general, a fuse in the memory device is made of a fusible material, e.g., polycrystalline silicon, is formed on an insulating film, and is covered with a protective film, e.g., a phosphosilicate glass (PSG) film (reference example, cf. David W. Greve, "Programming Mechanism of Polysilicon Resistor Fuses", IEEE Transactions on Electron Devices, vol. ED-29, No. 4, April 1982, pp. 719 to 724, particularly, FIG. 1b). Usually the fuse has the shape of a bow-tie, i.e., a long narrow center portion and two wider pad portions. The two pad portions are joined by the center portion and are connected to conductor lines, e.g., aluminum lines, respectively.

The fuse is blown by feeding it an excess current, and a pulse voltage is adopted as the applied voltage. When the fuse is blown, it bursts in such a manner that the protective PSG film is also broken, forming an opening in the film. This opening must be filled by re-forming the protective PSG film to prevent contaminants from entering the memory cell.

SUMMARY OF THE INVENTION

An object of the present invention is to provide a method electrically blowing a fuse without breaking a protective film formed on the fuse, in order to write information into a memory device.

The above object and other objects of the present invention are attained by a method of writing information into a fuse-type ROM provided with fuses by selectively and electrically blowing the fuses which are formed on an insulating film on a substrate, are connected to conductor lines, and are covered by a protective film, wherein a ramp voltage is used as an applied voltage for blowing the fuses, to blow the fuses without breaking the protective film.

It is preferable that the ramp voltage increase linearly in value at a rate of from $10^3$ to $10^5$ V/sec to a peak value. If the increase rate for the voltage is more than $10^5$ V/sec, such voltage is similar to a pulse voltage and the protective film covering the fuses will be broken in such a manner as to form openings in the film. If the increase rate for the voltage is from about 10 to $10^3$ V/sec, according to experiments carried out by the inventor, the protective film is sometimes broken. Furthermore, if the increase rate for the voltage is less than 5 V/sec, the aluminum positive pole line of the conductor lines becomes molten and flows to form a very thin aluminum film, so that a short occurs in the circuit and the fuse is not blown.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 1:
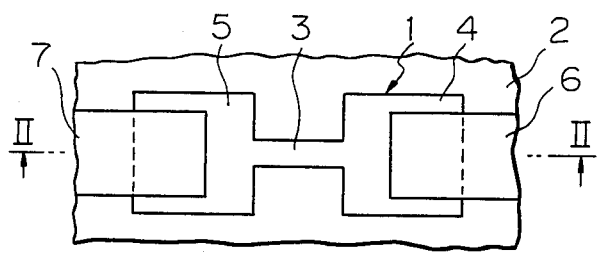
FIG. 1 is a partial plan view of a memory device provided with a fuse.
Figure 2:
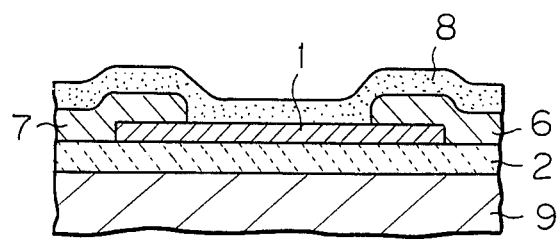
FIG. 2 is a sectional view taken on line II—II in FIG. 1.

Referring to FIGS. 1 and 2, a fuse section of a memory device comprises, in general, a fuse 1 (of , e.g., polycrystalline silicon), an insulating film 2 (of, e.g., SiO$_2$) under the fuse, a protective film 8 (of, e.g., PSG) on the fuse, and conductor lines 6 and 7 (of, e.g., aluminum) connected to the fuse. The fuse 1 has a bow-tie shape consisting of a long narrow center portion 3 and two wider pad portions 4 and 5 which are joined to the center portion and are connected to the conductor lines 6 and 7, respectively. The insulating layer 2 is formed on a substrate 9 (of, e.g., single crystalline silicon). FIG. 1 shows the fuse section without the protective film 8.

The fuse section is produced in accordance with a conventional process as follows. First, the SiO$_2$ insulating film 2 is formed on the silicon substrate (wafer) 9 by a thermal oxidizing method or a chemical vapor deposition (CVD) method. A polycrystalline silicon layer is formed on the insulating film 2 and is shaped into a fuse 1, as shown in FIG. 1, by a conventional lithographic method (e.g., a photoetching method). Usually shape of the fuse 1 consists of a long narrow center portion 3, which is the portion to be broken, and square pad portions 4 and 5, which are joined by the center portion 3. It is possible to use nickel-chromium alloy (NiCr), titanium-tungsten alloy (TiW), and platinum silicide (PtSi) as the fuse material instead of polycrystalline silicon.

Next, in order to form the conductor lines 6 and 7, an aluminum or aluminum-base alloy (e.g., Al-2% Si, Al-1% Cu) is deposited on the exposed surface and is shaped into a predetermined pattern by a conventional lithographic method (e.g, a photoetching method). The aluminum conductor lines 6 and 7 are electrically connected to the pad portions 4 and 5 of the fuse 1. It is possible to form each of the conductor lines 6 and 7 from a doped polycrystalline silicon line and an aluminum (or an aluminum-base alloy) piece which lies on each of the pad portions and on each doped polycrystalline silicon line, connecting them together.

Finally, the PSG protective film 8 is formed on the exposed surfaces of the fuse 1, the conductor lines 6 and 7, and the insulating film 2 by a CVD method. It is possible to use silicon dioxide and silicon nitride as the material for the protective film instead of PSG.

Figure 3:
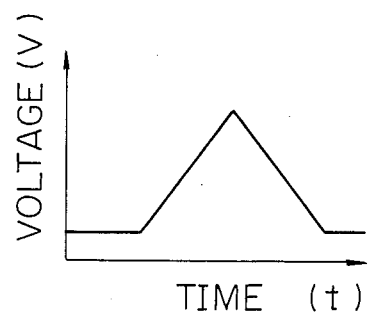
FIG. 3 is a waveform diagram of a ramp voltage for blowing fuses according to the present invention.
Figure 4:
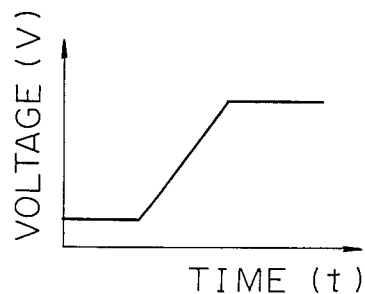
FIG. 4 is an another waveform diagram of a ramp voltage according to the present invention.
Figure 5:
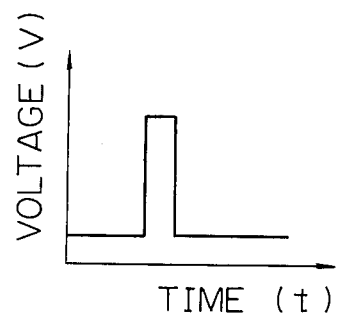
FIG. 5 is a waveform diagram of a conventional pulse voltage for blowing fuses.

A ramp voltage is applied to the formed polycrystalline silicon fuse 1. This ramp voltage is increased at a constant rate of from $10^3$ to $10^5$ V/sec, according to the present invention, so as to blow the center portion 3 of the fuse 1. The ramp voltage has, for example, a waveform as shown in FIG. 3, and such a ramp voltage can be obtained by a ramp generator. Since the fuse 1 is blown before the ramp voltage attains its peak value, the ramp voltage may have another waveform, as shown in FIG. 4. When the fuse 1 is blown in accordance with the present invention, it is found that an opening is not formed at the portion of the PSG protective film 8 corresponding to the blown portion of the fuse 1. From observation of the blown fuse 1, it is found that aluminum flows thinly from the positive pole side of the conductor line 6 (or 7) to the negative pole side of the other conductor line 7 (or 6) for an instant at the initial stage of the melting of the polycrystalline silicon of the fuse 1, forming a very thin aluminum film, and that, subsequently, the fuse is blown. It is thought that a part of the current flows through this very thin aluminum film, thereby, decreasing the heating rate immediately before the blowout, so that the PSG protective film 8 is not broken.

Where the formed fuse is blown by applying a pulse voltage, as shown in FIG. 5, the thin aluminum film is not formed, and, as there is no flow of aluminum an opening is formed at a portion of the PSG protective film 8 corresponding to the blown portion of the fuse 1.

EXAMPLE

Figure 6:
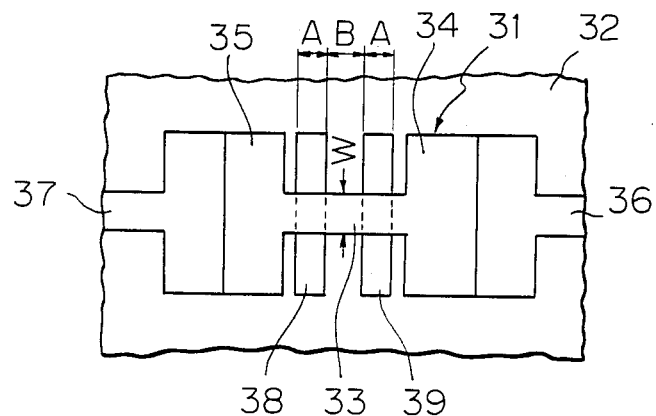
FIG. 6 is a partial plan view of a memory device provided with a fuse, used for experiments.

A polycrystalline silicon fuse, as shown in FIG. 6, is produced and is electrically blown with a pulse voltage or a ramp voltage.

An SiO$_2$ film 32 (having a thickness of 1.0 μm) is formed on a silicon wafer (not shown) by a thermal oxidizing method. Two grooves 38 and 39 (having a depth of 0.7 μm, a width A of 5 μm, and a distance B between the grooves of 6 μm) are formed by selectively etching the SiO$_2$ film 32. A polycrystalline silicon layer (having a thickness of 0.4 μm) is deposited on the SiO$_2$ film 32 and is selectively etched to form a bow-tie shaped fuse 31 (FIG. 6). The fuse 31 consists of a long narrow center portion 33 (having a width W of 6 μm) and two pad portions 34 and 35. An aluminum film (having a thickness of 1.0 μm) is deposited on the surfaces of the SiO$_2$ film 32 and the fuse 31 by a vapor deposition method and is selectively etched to form two conductor lines 36 and 37. The end portion of each of the aluminum conductor lines 36 and 37 corresponds to and lies on about half of the pad portions 34 and 35, respectively. A PSG protective film (not shown) having a thickness of 1.0 μm is formed on the exposed surfaces of the fuse 31, the SiO$_2$ film 32, and the aluminum conductor lines 36 and 37, by a CVD method.

Figure 7:
FIG. 7 is an scanning electron microscope (SEM) photograph of a fuse after it has been blown with a pulse voltage.
Figure 8:
FIG. 8 is an enlarged SEM photograph of the fuse shown in FIG. 7.

When a pulse voltage, as shown in FIG. 5, is applied across the conductor lines 36 and 37 to blow the formed polycrystalline fuse 31, the center portion 33 is blown between the grooves 38 and 37 and simultaneously the PSG film is also broken to form an opening, as can be seen in the SEM photographs shown in FIGS. 7 and 8.

Figure 9:
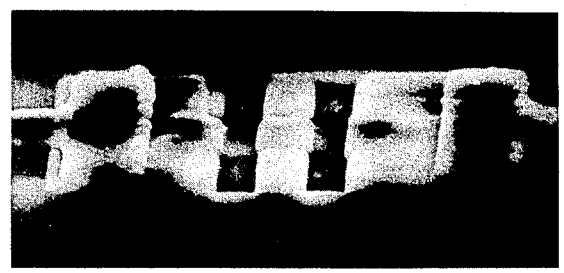
FIG. 9 is an SEM photograph of a fuse after it has been blown with a ramp voltage.
Figure 10:
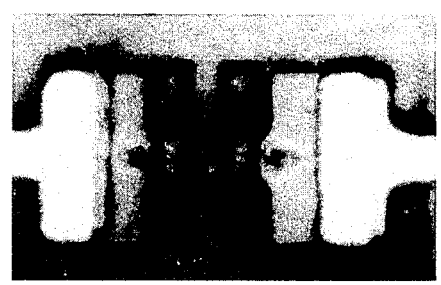
FIG. 10 is a microphotograph of a fuse with a protective film after it has been blown with a ramp voltage.

When a ramp voltage which is increased at a constant rate of $10^4$ V/sec to a peak value of 34 V is applied across the conductor lines 36 and 37, in accordance with the present invention, the center portion 33 is blown at a ramp voltage of 27 V, but there is no corresponding opening in the PSG film on the blown fuse, as can be seen in the SEM photograph shown in FIG. 9. The fuse was examined with an optical microphotograph and the result of this examination can be seen in the photograph shown in FIG. 10. The center portion 33 of polycrystalline silicon is clearly broken (opened), and the conductor lines 36 and 37 are disconnected.

In the case of the method of blowing a fuse according to the present invention, the fuse can be blown without breaking the protective film formed on the fuse, so that it is necessary to re-form the protective film.

It will be obvious that the present invention is not restricted to the above-mentioned embodiments and that many variations are possible for persons skilled in the art without departing from the scope of the invention.

I claim:

1. A method of writing information into a fuse-type ROM provided with fuses which are formed on an insulating film on a substrate, connected to conductor lines, and covered by a protective film, comprising the step of selectively and electrically blowing the fuses by applying a ramp voltage having a substantially linearly increasing gradient to a peak value at a rate of $10^3$ to $10^5$ volts/second so that the protective film is not broken.

2. A method according to claim 1, wherein said ramp voltage has a peak value and said step comprises applying the ramp voltage to blow the fuses before the applied voltage attains said peak value.

3. A method according to claim 1, wherein the fuses are made of a material selected from the group consisting of polycrystalline silicon, NiCr, TiW and PtSi.

4. A method according to claim 1, wherein the conductor lines are made of a metal selected from the group consisting of aluminum and aluminum-based alloys.

5. A method according to claim 1, wherein each of the conductor lines comprises a doped polycrystalline silicon line and an aluminum piece connecting with the fuse and with the doped polycrystalline silicon line.

6. A method according to claim 1, wherein the protective film is made of a material selected from the group consisting of phosphosilicate glass, silicon dioxide, and silicon nitride.

7. A method of writing information into a fuse-type ROM provided with fuses formed on an insulating substrate and covered by a protective film, comprising the step of applying a ramp voltage to selectively and electrically blow the fuses without breaking the protective film.

8. A method according to claim 7, wherein said applying step comprises increasing the ramp voltage substantially linearly, to a peak value, at a rate of $10^3$ v/sec.

9. A method according to claim 7, wherein said ramp voltage has a peak value and wherein said applying step comprises applying the ramp voltage to blow the fuses before the applied voltage attains the peak value.

* * * * *